United States Patent
Min

(10) Patent No.: US 6,177,896 B1
(45) Date of Patent: Jan. 23, 2001

(54) OVERSAMPLING DIGITAL/ANALOG CONVERTER

(75) Inventor: Byung Moo Min, Kyungki-do (KR)

(73) Assignee: Hyundai Electronics Industries Co., Ltd., Ichon-shi (KR)

( * ) Notice: Under 35 U.S.C. 154(b), the term of this patent shall be extended for 0 days.

(21) Appl. No.: 09/229,970

(22) Filed: Jan. 14, 1999

(30) Foreign Application Priority Data

Mar. 13, 1998 (KR) .................................................. 98/8518

(51) Int. Cl.$^7$ ...................................................... H03M 3/00
(52) U.S. Cl. ............................ 341/143; 341/144; 341/150
(58) Field of Search .................................... 341/144, 143, 341/150, 145; 364/724.16

(56) References Cited

U.S. PATENT DOCUMENTS

| | | | |
|---|---|---|---|
| 5,392,042 | 2/1995 | Pellon | 341/143 |
| 5,712,635 | * 1/1998 | Wilson et al. | 341/144 |
| 5,821,892 | * 10/1998 | Smith | 341/150 |
| 5,995,030 | * 11/1999 | Cabler | 341/143 |

OTHER PUBLICATIONS

David K. Su et al., A CMOS Oversampling D/A Converter with a Current–Mode Semidigital Reconstruction Filter, Dec. 1993, IEEE Journal of Solid State Circuits, vol. 28, No. 12, pp. 1224–1233.

David K. Su, A CMOS Oversampling D/A Converter with a Current–Mode Semidigital Reconstruction Filter Dec. 1993, IEEE vol. 28, No. 12.*

* cited by examiner

Primary Examiner—Brian Young
Assistant Examiner—John Nguyen
(74) Attorney, Agent, or Firm—Fleshner & Kim, LLP

(57) ABSTRACT

An oversampling digital/analog (D/A) converter is provided that has a reduced circuit area and an improved dynamic range of a converted voltage signal. The oversampling D/A converter includes an interpolation filter that receives a digital signal and oversamples the digital signal to provide a multibit digital signal. A digital noise shaper quantizes a noise contained in the digital signal passed through the interpolation filter, and an IFIR (Interpolated Finite Impulse Response) reconstruction filter converts a noise shaped digital signal in an analog signal corresponding to the noise shaped digital signal.

20 Claims, 4 Drawing Sheets

US 6,177,896 B1

OVERSAMPLING DIGITAL/ANALOG CONVERTER

BACKGROUND OF THE INVENTION

1. Field of the Invention

The present invention relates to a digital/analog converter, and more particularly, to an oversampling digital/analog converter using an Interpolated Finite Impulse Response (IFIR) filter.

2. Background of the Related Art

A related art oversampling digital/analog converter will now be described. FIG. 1 illustrates a system block diagram of the related art digital/analog converter (DAC). A sigma delta DAC is generally used as a digital/analog converter.

Referring to FIG. 1, related art the sigma delta digital/analog converter includes an interpolation filter 11, a digital noise shaper 12 and an FIR reconstruction filter 13. The interpolation filter 11 receives a multibit digital word of first sampling frequency and converts it to a multibit digital word of a second sampling frequency higher than the first sampling frequency. The second sampling frequency multibit digital word is then converted into a single-bit word in the digital noise shaper 12. The single-bit quantization used for the conversion in the digital noise shaper 12 shifts a quantization noise from a low frequency band to a high frequency band (noise shaping). The FIR reconstruction filter 13 has low pass filters, which either have a switch-capacitor or have a resistor and a capacitor. The low pass filter with the switch-capacitor, which has a non-linear phase response, is embodied as a CMOS integrated circuit. The low pass filter with the resistor and the capacitor provides a wider dynamic range, but it requires a precise matching between components for precise filtering.

FIG. 2 illustrates a related art Finite Impulse Response (FIR) type reconstruction filter. Referring to FIG. 2, the related art FIR type reconstruction filter includes a plurality of one bit shift registers SR1, SR2, SR3, ..., SRn connected in series, a plurality of current sources CS1, CS2, CS3, ..., CSn that each supply a respective current to an I–V converter part 21 or drain the respective current to ground in response to a signal from the shift register SR1, SR2, SR3, ..., SRn. The I–V converter part 21 converts the selectively received current depending on respective outputs of the shift registers SR1, SR2, SR3, ..., SRn to a voltage.

The operation of the related art oversampling digital/analog converter will now be described. First, the related art oversampling digital/analog converter subjects a one bit data stream to low-pass filtering using a FIR semi-digital reconstruction filter and subjects a resulting current to I–V conversion. That is, as shown in FIGS. 1 and 2, a noise shaped digital data provided to the FIR reconstruction filter 13 is converted into an analog signal. In other words, the noise shaped digital data stream is provided to the shift registers SR1, SR2, ..., SRn in the FIR reconstruction filter 13. If the shift register provides a data "0", the current from a current source of the shift register is connected to ground. For example, if the first shift register SR1 provides a data "1", the second shift register SR2 provides a data "0" and the third shift register SR3 provides a data "1", paths of the first and third current sources CS1 and CS3 are established toward the I–V converter part 21 and a path of the second current source CS2 is established to the ground. Therefore, the currents from the first current source CS1 and the third current source CS3 are together provided to the I–V converter part 21. The I–V converter part 21 converts the received current into a voltage corresponding to the digital data stream received at the shift registers. In this instance, to convert the digital data into a voltage corresponding to the digital data with more precision, more current sources are required. That is, the more orders the filter is extended, the more exact the analog output can be obtained.

In summary, as shown in FIG. 1, digital data is provided to the FIR reconstruction filter 13 through the interpolation filter 11 and the digital noise shaper 12. The FIR reconstruction filter 13 subjects the digital data to low pass filtering according to a transmission function. The transmission function of the FIR reconstruction filter can be expressed as equation 1 as follows.

$$H(Z) = a_1 z^{-1} + a_2 z^{-2} + \ldots, a_n z^{-n} \quad (1)$$

Therefore, when the noise shaped digital data is passed through the FIR reconstruction filter 13, a high frequency component in the noise shaped digital data is removed, which leaves a baseband signal.

However, as described above the related art oversampling digital/analog converter has various problems. First, the high order of FIR reconstruction filter required for conversion of a signal from digital to analog results in an increase of occupied area due to the filter system. Second, the error in a filter coefficient caused by process change coming from increased order degrades a filter performance. Third, the current to the I–V converter part being at least greater than "0" at the minimum and smaller than a sum of all current sources at the maximum places a limitation on a dynamic range of the converted voltage signal.

SUMMARY OF THE INVENTION

An object of the present invention is to provide a digital/analog converter that substantially obviates one or more of the problems caused by limitations and disadvantages of the related art.

Another object of the present invention is to provide a digital/analog converter that occupies a reduced area.

Another object of the present invention is to provide a digital/analog converter that has an increased dynamic range of a converted voltage signal.

To achieve at least these objects and other advantages in a whole or in parts and in accordance with the purpose of the present invention, as embodied and broadly described, an over sampling digital/analog converter includes an interpolation filter that receives a digital signal and oversamples the digital signal to generate a multibit digital signal; a digital noise shaper that quantizes noise in the multibit digital signal to output a noise shaped digital signal; and an Interpolated Finite Impulse Response (IFIR) reconstruction filter that converts the noise shaped digital signal to a corresponding analog signal.

To further achieve the above objects in a whole or in part, there is provided a digital/analog converter according to the present invention that includes a plurality of shift registers coupled in series that receive a noise shaped digital signal; a plurality of current sources, wherein each of the current sources is connected to an output terminal of a unit of the shift registers, wherein each unit comprises more than one shift register; and an I–V converter part that selectively receives currents from the current sources based on an output signal from a corresponding unit, wherein the I–V converter part converts the received currents to a voltage.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

In the drawings.

DETAILED DESCRIPTION OF PREFERRED EMBODIMENTS

Figure 1:
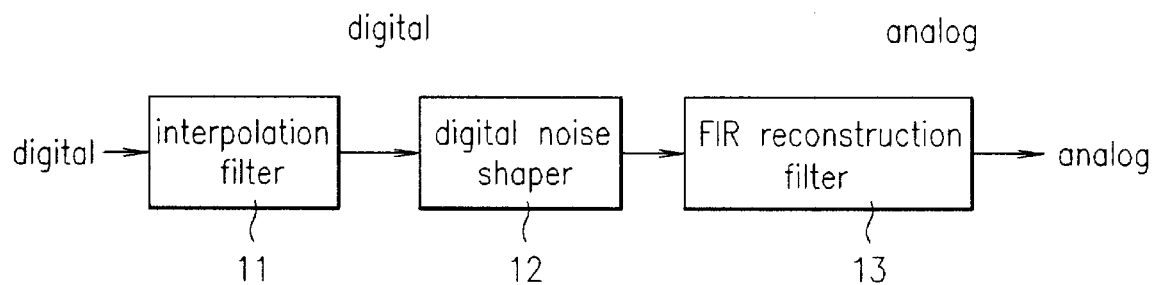
FIG. 1 is a block diagram showing a related art oversampling digital/analog converter.
Figure 2:
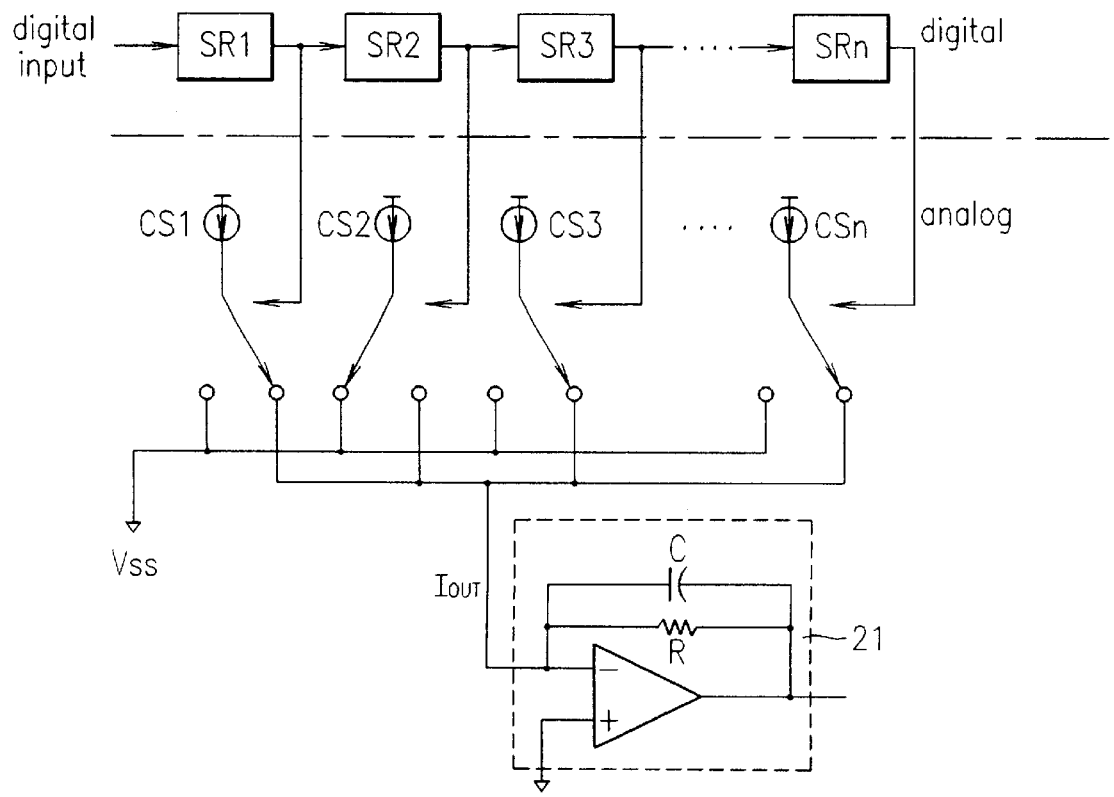
FIG. 2 is a diagram showing a related art FIR reconstruction filter.
Figure 3:
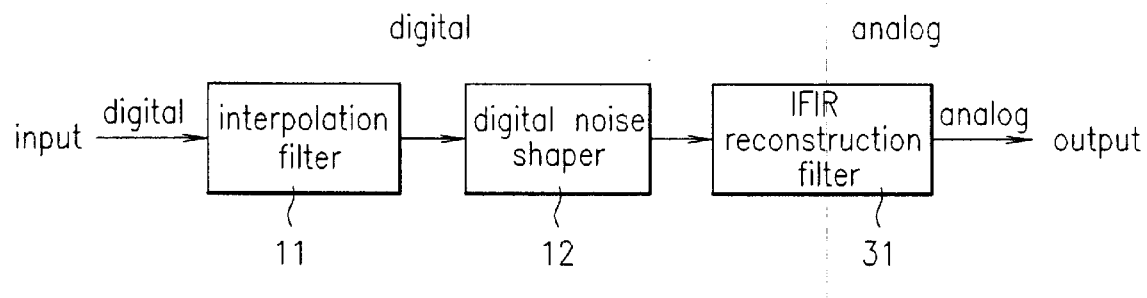
FIG. 3 is a diagram showing an oversampling digital/analog converter in accordance with a preferred embodiment of the present invention.
Figure 4:
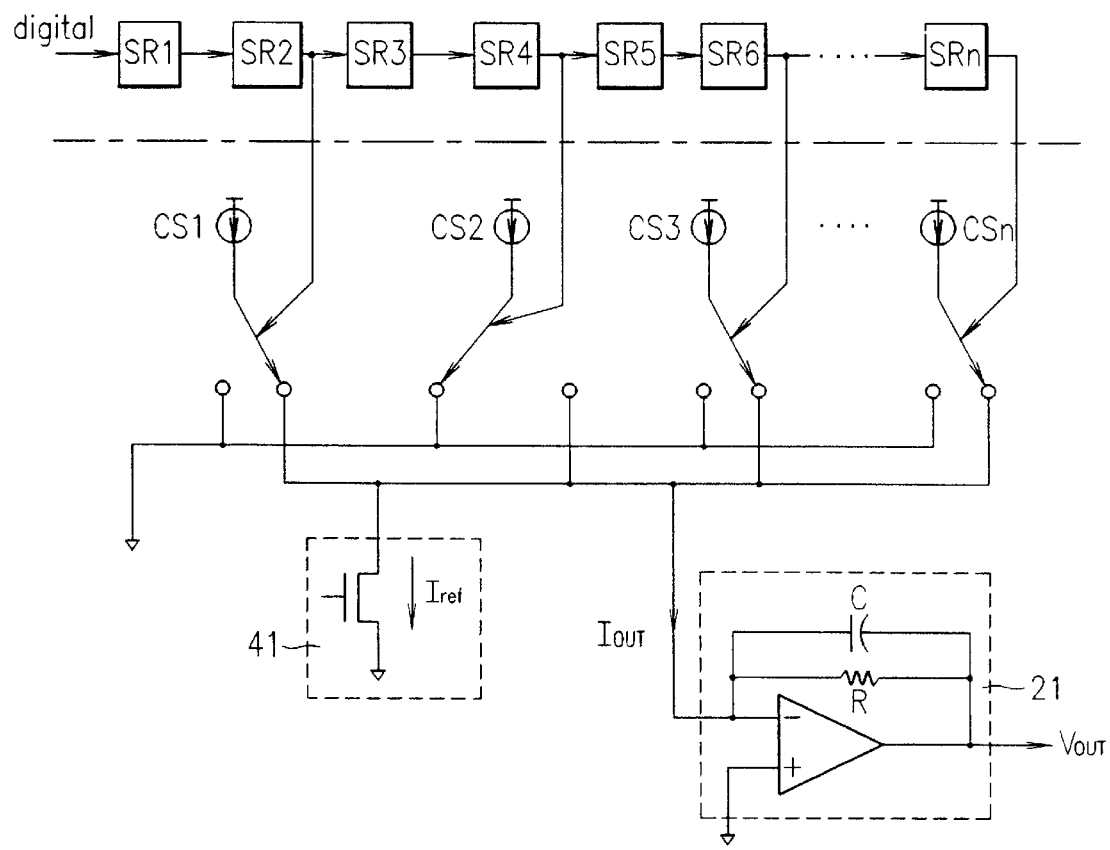
FIG. 4 is a diagram that illustrates an IFIR reconstruction filter in accordance with a preferred embodiment of the present invention; and, FIGS. 5a to 5c are diagrams that illustrate operation timing waveforms of the IFIR reconstruction filter of the present invention.

As shown in FIG. 3, an oversampling digital/analog converter in accordance with a preferred embodiment of the present invention includes an interpolation filter 11, a digital noise shaper 12 and an Interpolated Finite Impulse Response (IFIR) reconstruction filter 31. FIG. 4 is a diagram that illustrates a preferred embodiment of a system of the IFIR reconstruction filter 31 in accordance with the present invention.

As shown in FIG. 4, the preferred embodiment of the IFIR reconstruction filter 31 includes a plurality of one bit shift registers SR1, SR2, SR3, ..., SRn coupled in series, and a plurality of current sources CS1, CS2, ..., CSn respectively supplying a current to an I–V converter part or draining the current to ground. The plurality of current sources CS1, CS2, ..., CSn preferably supply or drain the corresponding current in response to a signal from an even numbered shift register SR2, SR4, ..., SRn. The I–V converter part 21 converts a plurality of the currents selectively received from the current sources CS1, CS2, CS3, ..., CSn to a voltage.

Preferably, a DC-offset correcting part 41 by-passes a prescribed amount of the current source to correct a dynamic range of an output voltage of the I–V converter 21. Depending on an output of one unit of the shift registers SR1, SR2, ..., SRn, which is preferably two shift registers, a corresponding source current CS1, CS2, CS3, ..., CSn may or may not be coupled to an input terminal on the I–V converter part 21. Thus, a number of the current sources is preferably one half of a number of the shift registers. However, the present invention is not intended to be so limited. For example, even though one switching part is preferably coupled to every two one bit shift registers in the preferred embodiment, one switching part can be coupled to more than two one bit shift registers.

Operations of the preferred embodiment of the IFIR filter 31 in accordance with the present invention will now be described. As shown in FIG. 3, when a noise shaped digital data is provided to the IFIR reconstruction filter 31, the IFIR filter 31 provides an analog signal corresponding to the digital data. In other words, the noise shaped digital data from the digital noise shaper 12 is provided to the plurality of one bit shift registers or a shift register in the IFIR reconstruction filter 31. Since the shift registers are operative by two as one unit, a corresponding source current is provided either to the I–V converter part 21 or to the ground terminal preferably depending on an output of every second shift register. Thus, the corresponding current source CS1, CS2, CS3, ..., CSn is coupled to the I–V converter part 21 if the one bit shift registers SR2, SR4, ..., SRn respectively have an output data "1" and to the ground terminal if the one bit shift register SR2, SR4, ..., SRn has an output data "0".

For example, assume the second shift register SR2 has an output data "1", the fourth shift register SR4 has an output data "0", and the sixth shift register SR6 has an output data "1." As the output data from the second and sixth shift registers SR2 and SR6 are "1", the currents from the first and third current sources are coupled to the I–V converter part 21. As the output data from the fourth shift register SR4 is "0", the second current source is coupled to the ground terminal. Accordingly, the currents from the first current source CS1 and the third current source CS3 are provided together to the I–V converter part 21. The operation of the IFIR filter 31 of the preferred embodiment can be expressed by a general IFIR filter transmission function of equation 2 as follows:

$$H(Z) = a_1 z^{-2} + a_2 z^{-4} + \ldots, a_n z^{-2n} \tag{2}$$

The currents passed through the IFIR filter 31 and provided to the I–V converter part 21 are converted into a voltage signal. An image band that occurred when the signal passes through the IFIR filter is converted into a voltage signal, and at the same time low pass-filtered in the I–V converter part 21.

Figure 5A:
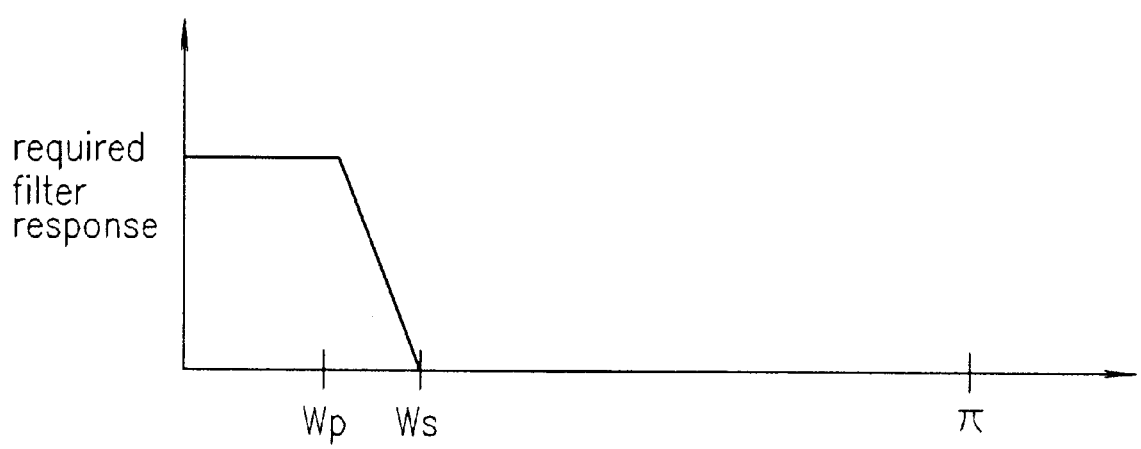
Figure 5B:
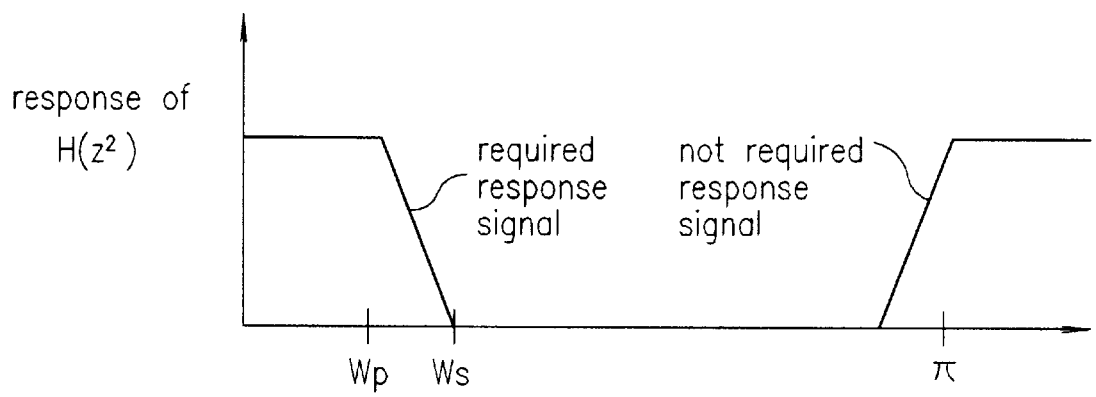
Figure 5C:
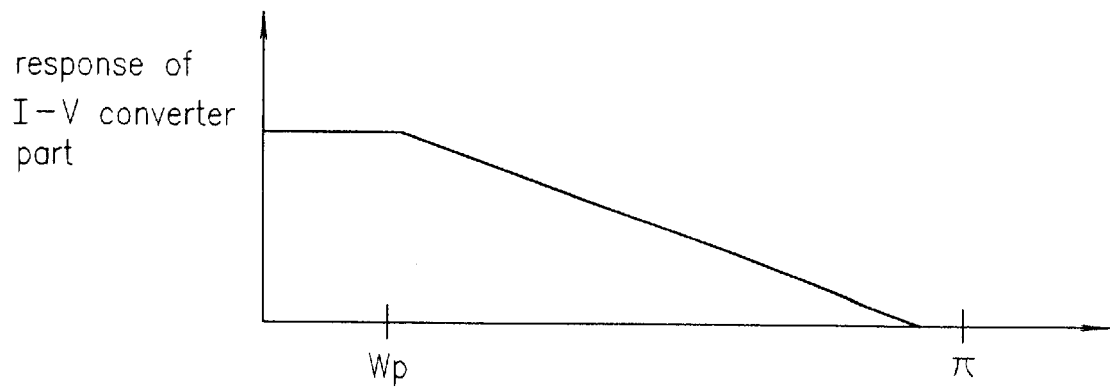

FIGS. 5a to 5c illustrate operation timing diagrams of the preferred embodiment of the IFIR reconstruction filter 31 according to the present invention. FIG. 5a illustrates a required filter response signal. As shown in FIG. 5b, when a preferred embodiment of an IFIR filter according to the present invention is extended as compared to the related art, the required filter response signals as well as not required filter response signals are obtained at the same time. However, as shown in FIG. 5c, the response signal that is not required is eliminated by the I–V converter part 21, which converts the current source into a voltage signal. In the meantime, as shown in FIG. 4, the DC-offset correcting part 41 preferably subtracts a half of a maximum current $I_{out.max}$ before the current is converted into a voltage. The ½ $I_{out.max}$ is subtracted from the current to preferably make the current provided to the I–V converter part 21 fall on a range of $-½\ I_{out.max} < I_{out} < ½\ I_{out.max}$ according to the preferred embodiment, which increases a dynamic range of the voltage signal converted by the I–V converter part 21 two times.

As described above, an oversampling digital/analog converter according to the preferred embodiment of the present invention has various advantages. A number of current sources may be reduced (e.g., by ½, 1/n or the like) using an IFIR filter having one switching part for every "n" shift registers. A DC-offset correcting part extends a dynamic range of the converted voltage signal and improves an S/N ratio. Further, reducing a number of current sources reduces or minimizes a chip area, and a simple IFIR filter structure of the preferred embodiments easily makes the IFIR filter operative at a low voltage. Accordingly, a digital/analog converter with improved performance characteristics is provided. In addition, the use of the IFIR filter according to the preferred embodiments that reduces the number of current sources is less sensitive to a filtering band characteristic variation, which prevents degradation of the digital/analog converter performance caused by degradation of matching in fabrication of a semiconductor device.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A digital/analog (D/A) converter, comprising:
   a first filer that receives a digital signal and oversamples the digital signal to generate a multibit digital signal;
   a digital noise shaper that quantizes noise in the multibit digital signal to output a noise shaped digital signal; and
   an Interpolated Finite Impulse Response (IFIR) reconstruction filter that converts the noise shaped digital signal to a corresponding analog signal, wherein the IFIR reconstruction filter comprises,
      a plurality of N shift registers coupled in series that receive the noise shaped digital signal, wherein each of the shift registers is a one bit shift register, and
      a plurality of current sources, wherein the current sources are less than N in number, and wherein each of the current sources is connected to an output terminal of a corresponding one of the shift registers.

2. The D/A converter of claim 1, wherein the digital noise shaper removes an image band contained the analog signal output by IFIR filter, and wherein the first filter is an interpolation filter.

3. The D/A converter of claim 1, wherein the plurality of shift registers are divided into a plurality of units, wherein said each of the current sources is connected to an output terminal of a corresponding unit of the shift registers, wherein each unit comprises more than one shift register, and wherein the D/A converter further comprises an I–V converter part that selectively receives currents from the current sources based on an output signal from the corresponding unit, wherein the I–V converter part converts the received currents to a voltage.

4. The D/A converter of claim 3, further comprising a DC-offset part coupled to the plurality of current sources, wherein the DC-offset part reduces the currents output by the current sources prior to receipt by the I–V converter part to extend a dynamic range of the voltage.

5. The D/A converter of claim 4, wherein the current source connected to an output terminal of each of the units provides a current to the I–V converter part when the corresponding output signal is "1" and provides the current to a ground terminal when the corresponding output signal is "0".

6. The D/A converter of claim 4, wherein the DC-offset correcting part by-passes one half of a maximum current output by the current sources to the I–V converter part, and wherein each of the shift registers is a one bit shift register.

7. The D/A converter of claim 3, wherein an M number of the shift registers forms said each unit, and wherein a ratio of the current sources to shift registers is 1/M, wherein M is equal to 2.

8. A digital/analog (D/A) converter, comprising:
   a plurality of N shift registers coupled in series that receive a digital signal, wherein the shift registers are divided into units;
   a plurality of current sources, wherein each of the current sources is connected to an output terminal of a unit of the shift registers, wherein each unit comprises more than one shift register; and
   an I–V converter part that selectively receives currents from the current sources based on an output signal from a corresponding unit, wherein the I–V converter part converts the received currents to a voltage.

9. The D/A converter of claim 8, further comprising a DC-offset part coupled to the plurality of current sources, wherein the DC-offset part reduces the currents output by the current sources prior to receipt by the I–V converter part to extend a dynamic range of the voltage.

10. The D/A converter of claim 9, wherein the DC-offset correcting part by-passes one half of a maximum current output by the current sources to the I–V converter part, and wherein the digital signal is a noise shaped digital signal.

11. The D/A converter of claim 10, further comprising:
    a first filter that receives an input digital signal and oversamples the input digital signal to generate a multibit digital signal; and
    a digital noise shaper that quantizes noise in the multibit digital signal to output the digital signal.

12. The D/A converter of claim 8, wherein the current source connected to an output terminal of each of the units provides a current to the I–V converter part when the corresponding output signal is "1" and provides the current to a ground terminal when the corresponding output signal is "0".

13. The D/A converter of claim 8, wherein each of the shift registers is a one bit shift register.

14. The D/A converter of claim 8, wherein the current source is provided for every M shift registers, wherein M is an integer greater than 1, and wherein the I–V converter part includes a low pass filter.

15. The D/A converter of claim 8, wherein a number of the current sources corresponds to one half N of the N shift registers in the plurality of shift registers, and wherein each of the shift registers is a one bit shift register.

16. The D/A converter of claim 3, wherein an M number of the shift registers forms said each unit, and wherein a ratio of the current sources to shift registers is 1/M, wherein M is an integer greater than 1.

17. A digital/analog (D/A) converter, comprising:
    a first filter that receives a digital signal and oversamples the digital signal to generate a multibit digital signal;
    a digital noise shaper that quantizes noise in the multibit digital signal to output a noise shaped digital signal;
    an Interpolated Finite Impulse Response (IFIR) reconstruction filter that converts the noise shaped digital signal to a corresponding analog signal, wherein the IFIR comprises,
       a plurality of shift registers coupled in series that receive a digital signal, and
       a plurality of current sources, wherein each of the current sources is connected to an output terminal of a corresponding one of the shift registers,
    an I–V converter that selectively receives currents from the current sources based on an output signal from the corresponding shift register, wherein the I–V converter converts the received currents to a voltage; and
    a DC-offset part coupled to the plurality of current sources, wherein the DC-offset part reduces the selectively received currents output by the current sources prior to receipt by the I–V converter part to extend a dynamic range of the voltage.

18. The D/A converter of claim 17, wherein the I–V converter is a single-pole RC low-pass filter.

19. The D/A converter of claim 18, wherein the an I–V converter comprises:
- an operational amplifier, wherein a reference voltage is coupled to a non-inverting terminal of the operational amplifier;
- a capacitor and a resistor coupled in parallel between an output of the operational amplifier and an inverting input terminal of the operational amplifier, wherein the inverting terminal is also coupled to the DC-offset part and to the received currents, wherein the DC-offset part by-passes one half of a prescribed current, and wherein the prescribed current is a maximum current that can be output by the current sources to the I–V converter.

20. The D/A converter of claim 17, wherein a number of current sources is less than a number of shift registers, and wherein each of the shift registers is a one bit shift register.

* * * * *